United States Patent
Tut et al.

(10) Patent No.: US 8,890,271 B2
(45) Date of Patent: Nov. 18, 2014

(54) SILICON NITRIDE LIGHT PIPES FOR IMAGE SENSORS

(75) Inventors: Turgut Tut, Cambridge, MA (US); Peter Duane, Waltham, MA (US); Young-June Yu, Cranbury, NJ (US); Winnie N. Ye, Ottawa (CA); Munib Wober, Topsfield, MA (US); Kenneth B. Crozier, Cambridge (AU)

(73) Assignees: Zena Technologies, Inc., Cambridge, MA (US); President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 12/966,535

(22) Filed: Dec. 13, 2010

(65) Prior Publication Data
US 2012/0001284 A1 Jan. 5, 2012

Related U.S. Application Data

(60) Provisional application No. 61/360,421, filed on Jun. 30, 2010.

(51) Int. Cl.
| | |
|---|---|
| *H01L 27/14* | (2006.01) |
| *H01L 31/0216* | (2014.01) |
| *H01L 21/311* | (2006.01) |
| *H01L 31/105* | (2006.01) |

(52) U.S. Cl.
CPC ........ *H01L 21/31116* (2013.01); *H01L 31/105* (2013.01); *H01L 31/02164* (2013.01); *H01L 31/02165* (2013.01)
USPC ............ 257/458; 257/E33.076; 257/E31.121; 257/E31.122; 438/57; 438/69; 438/72

(58) Field of Classification Search
CPC ................................ H01L 31/02162–31/02168
USPC .......... 257/186, 233, 292, E33.076–E33.077, 257/E31.115, E31.063, E27.133, E25.032, 257/458, E31.121–E31.122; 438/57, 69, 72
See application file for complete search history.

(56) References Cited

U.S. PATENT DOCUMENTS

| | | | |
|---|---|---|---|
| 1,918,848 | A | 4/1929 | Land |
| 3,903,427 | A | 9/1975 | Pack |

(Continued)

FOREIGN PATENT DOCUMENTS

| | | |
|---|---|---|
| EP | 0809303 B1 | 9/2006 |
| GB | 2348399 A | 4/2000 |

(Continued)

OTHER PUBLICATIONS

Silicon Nitride Nanopillars and Nanocones Formed by Nickel Nanoclusters and Inductively Coupled Plasma etching for Solar Cell Application, Sahoo et al., Taiwan, Dec. 21, 2009.*

(Continued)

*Primary Examiner* — William F Kraig
*Assistant Examiner* — Maliheh Malek
(74) *Attorney, Agent, or Firm* — Pillsbury Winthrop Shaw Pittman LLP

(57) ABSTRACT

Various embodiments for etching of silicon nitride ($Si_xN_y$) lightpipes, waveguides and pillars, fabricating photodiode elements, and integration of the silicon nitride elements with photodiode elements are described. The results show that the quantum efficiency of the photodetectors (PDs) can be increased using vertical silicon nitride vertical waveguides.

28 Claims, 8 Drawing Sheets

(56) References Cited

U.S. PATENT DOCUMENTS

| Patent No. | Date | Inventor | Cited |
|---|---|---|---|
| 4,017,332 A | 4/1977 | James | |
| 4,357,415 A | 11/1982 | Hartman | |
| 4,387,265 A | 6/1983 | Dalal | |
| 4,400,221 A | 8/1983 | Rahilly | |
| 4,443,890 A | 4/1984 | Eumurian | |
| 4,513,168 A | 4/1985 | Borden | |
| 4,620,237 A | 10/1986 | Traino | |
| 4,678,772 A | 7/1987 | Segal et al. | |
| 4,827,335 A | 5/1989 | Saito | |
| 4,846,556 A | 7/1989 | Haneda | |
| 4,880,613 A | 11/1989 | Satoh | |
| 4,896,941 A | 1/1990 | Hayashi | |
| 4,950,625 A | 8/1990 | Nakashima | |
| 4,971,928 A | 11/1990 | Fuller | |
| 4,972,244 A | 11/1990 | Buffet | |
| 5,096,520 A | 3/1992 | Faris | |
| 5,124,543 A | 6/1992 | Kawashima | |
| 5,247,349 A | 9/1993 | Olego | |
| 5,272,518 A | 12/1993 | Vincent | |
| 5,311,047 A | 5/1994 | Chang | |
| 5,347,147 A | 9/1994 | Jones | |
| 5,362,972 A | 11/1994 | Yazawa | |
| 5,374,841 A | 12/1994 | Goodwin | |
| 5,401,968 A | 3/1995 | Cox | |
| 5,449,626 A | 9/1995 | Hezel | |
| 5,468,652 A | 11/1995 | Gee | |
| 5,602,661 A | 2/1997 | Schadt | |
| 5,612,780 A | 3/1997 | Rickenbach | |
| 5,671,914 A | 9/1997 | Kalkhoran | |
| 5,696,863 A | 12/1997 | Kleinerman | |
| 5,723,945 A | 3/1998 | Schermerhorn | |
| 5,747,796 A | 5/1998 | Heard | |
| 5,767,507 A | 6/1998 | Unlu | |
| 5,798,535 A | 8/1998 | Huang | |
| 5,844,290 A | 12/1998 | Furumiya | |
| 5,853,446 A | 12/1998 | Carre | |
| 5,857,053 A | 1/1999 | Kane | |
| 5,877,492 A * | 3/1999 | Fujieda et al. | 250/208.1 |
| 5,880,495 A | 3/1999 | Chen | |
| 5,885,881 A * | 3/1999 | Ojha | 438/381 |
| 5,900,623 A | 5/1999 | Tsang et al. | |
| 5,943,463 A | 8/1999 | Unuma | |
| 5,968,528 A | 10/1999 | Deckner et al. | |
| 6,033,582 A | 3/2000 | Lee | |
| 6,037,243 A * | 3/2000 | Ha et al. | 438/528 |
| 6,046,466 A * | 4/2000 | Ishida et al. | 257/258 |
| 6,074,892 A * | 6/2000 | Bowers et al. | 438/57 |
| 6,100,551 A | 8/2000 | Lee | |
| 6,270,548 B1 | 8/2001 | Campbell | |
| 6,301,420 B1 | 10/2001 | Greenaway | |
| 6,326,649 B1 | 12/2001 | Chang | |
| 6,388,243 B1 | 5/2002 | Berezin | |
| 6,388,648 B1 | 5/2002 | Clifton | |
| 6,407,439 B1 | 6/2002 | Hier | |
| 6,459,034 B2 | 10/2002 | Muramoto et al. | |
| 6,463,204 B1 | 10/2002 | Ati | |
| 6,542,231 B1 | 4/2003 | Garrett | |
| 6,563,995 B2 | 5/2003 | Kane | |
| 6,566,723 B1 | 5/2003 | Vook | |
| 6,680,216 B2 * | 1/2004 | Kwasnick et al. | 438/57 |
| 6,709,929 B2 | 3/2004 | Zhang | |
| 6,720,594 B2 | 4/2004 | Rahn | |
| 6,771,314 B1 | 8/2004 | Bawolek | |
| 6,805,139 B1 | 10/2004 | Savas | |
| 6,812,473 B1 | 11/2004 | Amemiya | |
| 6,904,187 B2 * | 6/2005 | Fischer et al. | 385/5 |
| 6,927,145 B1 | 8/2005 | Yang | |
| 6,960,526 B1 | 11/2005 | Shah | |
| 6,967,120 B2 | 11/2005 | Jang | |
| 6,969,899 B2 | 11/2005 | Yaung | |
| 6,987,258 B2 | 1/2006 | Mates | |
| 6,996,147 B2 | 2/2006 | Majumdar | |
| 7,052,927 B1 | 5/2006 | Fletcher | |
| 7,064,372 B2 | 6/2006 | Duan | |
| 7,105,428 B2 | 9/2006 | Pan | |
| 7,106,938 B2 * | 9/2006 | Baek et al. | 385/131 |
| 7,109,517 B2 | 9/2006 | Zaidi | |
| 7,153,720 B2 | 12/2006 | Augusto | |
| 7,163,659 B2 | 1/2007 | Stasiak | |
| 7,208,783 B2 | 4/2007 | Palsule | |
| 7,230,286 B2 | 6/2007 | Cohen | |
| 7,235,475 B2 | 6/2007 | Kamins | |
| 7,241,434 B2 | 7/2007 | Anthony | |
| 7,254,151 B2 | 8/2007 | Lieber | |
| 7,262,400 B2 | 8/2007 | Yaung | |
| 7,265,328 B2 | 9/2007 | Mouli | |
| 7,272,287 B2 | 9/2007 | Bise | |
| 7,285,812 B2 * | 10/2007 | Tang et al. | 257/296 |
| 7,306,963 B2 | 12/2007 | Linden | |
| 7,307,327 B2 | 12/2007 | Bahl | |
| 7,311,889 B2 | 12/2007 | Awano | |
| 7,330,404 B2 | 2/2008 | Peng | |
| 7,335,962 B2 | 2/2008 | Mouli | |
| 7,336,860 B2 | 2/2008 | Cyr | |
| 7,358,583 B2 * | 4/2008 | Reznik et al. | 257/432 |
| 7,381,966 B2 | 6/2008 | Starikov | |
| 7,416,911 B2 | 8/2008 | Heath | |
| 7,446,025 B2 | 11/2008 | Cohen | |
| 7,462,774 B2 | 12/2008 | Roscheisen | |
| 7,471,428 B2 | 12/2008 | Ohara | |
| 7,491,269 B2 | 2/2009 | Legagneux | |
| 7,507,293 B2 | 3/2009 | Li | |
| 7,521,322 B2 * | 4/2009 | Tang et al. | 438/270 |
| 7,524,694 B2 | 4/2009 | Adkisson | |
| 7,582,587 B2 | 9/2009 | Gruev | |
| 7,582,857 B2 | 9/2009 | Gruev et al. | |
| 7,598,482 B1 | 10/2009 | Verhulst | |
| 7,622,367 B1 | 11/2009 | Nuzzo | |
| 7,626,685 B2 | 12/2009 | Jin | |
| 7,646,138 B2 | 1/2010 | Williams | |
| 7,646,943 B1 * | 1/2010 | Wober | 385/12 |
| 7,647,695 B2 | 1/2010 | MacNutt | |
| 7,649,665 B2 | 1/2010 | Kempa | |
| 7,655,860 B2 | 2/2010 | Parsons | |
| 7,663,202 B2 | 2/2010 | Wang et al. | |
| 7,692,860 B2 | 4/2010 | Sato et al. | |
| 7,704,806 B2 | 4/2010 | Chae | |
| 7,713,779 B2 | 5/2010 | Firon | |
| 7,719,678 B2 | 5/2010 | Kamins | |
| 7,719,688 B2 | 5/2010 | Kamins | |
| 7,732,769 B2 | 6/2010 | Snider | |
| 7,732,839 B2 | 6/2010 | Sebe | |
| 7,736,954 B2 | 6/2010 | Hussain | |
| 7,740,824 B2 | 6/2010 | Godfried | |
| 7,790,495 B2 * | 9/2010 | Assefa et al. | 438/63 |
| 7,888,155 B2 * | 2/2011 | Chen | 438/54 |
| 7,948,555 B2 * | 5/2011 | Kwon et al. | 348/374 |
| 8,030,729 B2 | 10/2011 | Quitoriano | |
| 8,035,184 B1 * | 10/2011 | Dutta et al. | 257/443 |
| 8,049,203 B2 | 11/2011 | Samuelson | |
| 8,063,450 B2 | 11/2011 | Wernersson et al. | |
| 8,067,299 B2 | 11/2011 | Samuelson | |
| 8,084,728 B2 | 12/2011 | Tsang | |
| 8,093,675 B2 | 1/2012 | Tsunemi et al. | |
| 8,118,170 B2 | 2/2012 | Sato | |
| 8,143,658 B2 | 3/2012 | Samuelson | |
| 8,193,524 B2 | 6/2012 | Bjoerk | |
| 8,208,776 B2 * | 6/2012 | Tokushima | 385/130 |
| 8,212,136 B2 | 7/2012 | Landis | |
| 8,212,138 B2 | 7/2012 | Landis | |
| 8,222,705 B2 * | 7/2012 | Ogino et al. | 257/396 |
| 8,242,353 B2 | 8/2012 | Karg | |
| 8,269,985 B2 | 9/2012 | Wober | |
| 8,274,039 B2 | 9/2012 | Wober | |
| 8,299,472 B2 | 10/2012 | Yu et al. | |
| 8,330,090 B2 | 12/2012 | Agarwal | |
| 8,384,007 B2 | 2/2013 | Yu et al. | |
| 8,455,857 B2 | 6/2013 | Samuelson | |
| 8,471,190 B2 * | 6/2013 | Wober et al. | 250/216 |
| 8,546,742 B2 | 10/2013 | Wober | |
| 2002/0020846 A1 | 2/2002 | Pi et al. | |
| 2002/0021879 A1 * | 2/2002 | Lee et al. | 385/129 |
| 2002/0104821 A1 | 8/2002 | Bazylenko | |
| 2002/0109082 A1 | 8/2002 | Nakayama | |

(56) References Cited

U.S. PATENT DOCUMENTS

| | | |
|---|---|---|
| 2002/0130311 A1 | 9/2002 | Lieber |
| 2002/0172820 A1 | 11/2002 | Majumdar |
| 2003/0003300 A1 | 1/2003 | Korgel |
| 2003/0006363 A1 | 1/2003 | Campbell |
| 2003/0077907 A1* | 4/2003 | Kao et al. .................. 438/700 |
| 2003/0089899 A1 | 5/2003 | Lieber |
| 2003/0103744 A1 | 6/2003 | Koyama |
| 2003/0132480 A1 | 7/2003 | Chau |
| 2003/0189202 A1 | 10/2003 | Li |
| 2003/0227090 A1* | 12/2003 | Okabe ....................... 257/760 |
| 2004/0026684 A1 | 2/2004 | Empedocles |
| 2004/0058058 A1 | 3/2004 | Shchegolikhin |
| 2004/0065362 A1 | 4/2004 | Watabe |
| 2004/0075464 A1 | 4/2004 | Samuelson |
| 2004/0095658 A1 | 5/2004 | Buretea |
| 2004/0109666 A1 | 6/2004 | Kim |
| 2004/0114847 A1* | 6/2004 | Fischer et al. ................ 385/5 |
| 2004/0118337 A1 | 6/2004 | Mizutani |
| 2004/0118377 A1 | 6/2004 | Bloms |
| 2004/0122328 A1 | 6/2004 | Wang |
| 2004/0124366 A1 | 7/2004 | Zeng |
| 2004/0155247 A1 | 8/2004 | Benthien |
| 2004/0156610 A1* | 8/2004 | Charlton et al. ............ 385/129 |
| 2004/0180461 A1 | 9/2004 | Yaung |
| 2004/0213307 A1 | 10/2004 | Lieber |
| 2004/0217086 A1* | 11/2004 | Kawashima ................. 216/41 |
| 2004/0223681 A1 | 11/2004 | Block |
| 2004/0241965 A1 | 12/2004 | Merritt |
| 2004/0252957 A1* | 12/2004 | Schmidt et al. ............ 385/131 |
| 2004/0261840 A1 | 12/2004 | Schmit |
| 2005/0009224 A1 | 1/2005 | Yang |
| 2005/0082676 A1 | 4/2005 | Andry |
| 2005/0087601 A1 | 4/2005 | Gerst, III |
| 2005/0095699 A1* | 5/2005 | Miyauchi et al. .......... 435/299.1 |
| 2005/0116271 A1 | 6/2005 | Kato |
| 2005/0133476 A1 | 6/2005 | Islam |
| 2005/0161662 A1 | 7/2005 | Majumdar |
| 2005/0164514 A1 | 7/2005 | Rauf |
| 2005/0190453 A1 | 9/2005 | Dobashi |
| 2005/0201704 A1 | 9/2005 | Ellwood |
| 2005/0218468 A1 | 10/2005 | Owen |
| 2005/0242409 A1 | 11/2005 | Yang |
| 2005/0284517 A1 | 12/2005 | Shinohara |
| 2006/0011362 A1 | 1/2006 | Tao |
| 2006/0038990 A1 | 2/2006 | Habib et al. |
| 2006/0113622 A1 | 6/2006 | Adkisson |
| 2006/0115230 A1* | 6/2006 | Komoguchi et al. ........ 385/146 |
| 2006/0121371 A1 | 6/2006 | Wu |
| 2006/0146323 A1 | 7/2006 | Bratkovski |
| 2006/0162766 A1 | 7/2006 | Gee |
| 2006/0260674 A1 | 11/2006 | Tran |
| 2006/0273262 A1 | 12/2006 | Sayag |
| 2006/0273389 A1 | 12/2006 | Cohen |
| 2006/0284118 A1 | 12/2006 | Asmussen |
| 2007/0012980 A1 | 1/2007 | Duan |
| 2007/0012985 A1 | 1/2007 | Stumbo |
| 2007/0023799 A1 | 2/2007 | Boettiger |
| 2007/0025504 A1 | 2/2007 | Tumer |
| 2007/0029545 A1 | 2/2007 | Striakhilev |
| 2007/0052050 A1 | 3/2007 | Dierickx |
| 2007/0076481 A1 | 4/2007 | Tennant |
| 2007/0082255 A1 | 4/2007 | Sun |
| 2007/0099292 A1 | 5/2007 | Miller |
| 2007/0104441 A1* | 5/2007 | Ahn et al. ................... 385/129 |
| 2007/0108371 A1 | 5/2007 | Stevens |
| 2007/0114622 A1 | 5/2007 | Adkisson |
| 2007/0120254 A1 | 5/2007 | Hurkx et al. |
| 2007/0126037 A1 | 6/2007 | Ikeda |
| 2007/0137697 A1 | 6/2007 | Kempa |
| 2007/0138376 A1 | 6/2007 | Naughton |
| 2007/0138380 A1* | 6/2007 | Adkisson et al. ......... 250/227.11 |
| 2007/0138459 A1 | 6/2007 | Wong |
| 2007/0139740 A1 | 6/2007 | Igura |
| 2007/0140638 A1 | 6/2007 | Yang |
| 2007/0145512 A1 | 6/2007 | Rhodes |
| 2007/0148599 A1 | 6/2007 | True |
| 2007/0152248 A1 | 7/2007 | Choi |
| 2007/0155025 A1 | 7/2007 | Zhang |
| 2007/0164270 A1 | 7/2007 | Majumdar |
| 2007/0170418 A1 | 7/2007 | Bowers |
| 2007/0172623 A1 | 7/2007 | Kresse |
| 2007/0187787 A1* | 8/2007 | Ackerson et al. ............ 257/428 |
| 2007/0196239 A1 | 8/2007 | Vink |
| 2007/0200054 A1 | 8/2007 | Reznik |
| 2007/0205483 A1 | 9/2007 | Williams |
| 2007/0217754 A1 | 9/2007 | Sasaki |
| 2007/0228421 A1 | 10/2007 | Shioya et al. |
| 2007/0238265 A1 | 10/2007 | Kurashina |
| 2007/0238285 A1 | 10/2007 | Borden |
| 2007/0241260 A1 | 10/2007 | Jaeger |
| 2007/0246689 A1 | 10/2007 | Ge |
| 2007/0248958 A1 | 10/2007 | Jovanovich |
| 2007/0272828 A1 | 11/2007 | Xu |
| 2007/0285378 A1 | 12/2007 | Lankhorst |
| 2007/0290193 A1 | 12/2007 | Tucker |
| 2007/0290265 A1* | 12/2007 | Augusto et al. ............. 257/351 |
| 2008/0001498 A1 | 1/2008 | Muller |
| 2008/0029701 A1 | 2/2008 | Onozawa |
| 2008/0036038 A1* | 2/2008 | Hersee et al. ............... 257/615 |
| 2008/0044984 A1 | 2/2008 | Hsieh |
| 2008/0047601 A1 | 2/2008 | Nag |
| 2008/0047604 A1 | 2/2008 | Korevaar et al. |
| 2008/0055451 A1 | 3/2008 | Kanbe |
| 2008/0065451 A1 | 3/2008 | For |
| 2008/0073742 A1 | 3/2008 | Adkisson |
| 2008/0079022 A1 | 4/2008 | Yamamoto |
| 2008/0079076 A1 | 4/2008 | Sheen |
| 2008/0083963 A1* | 4/2008 | Hsu et al. ................... 257/431 |
| 2008/0088014 A1 | 4/2008 | Adkisson |
| 2008/0090401 A1 | 4/2008 | Bratkovski |
| 2008/0092938 A1 | 4/2008 | Majumdar |
| 2008/0096308 A1 | 4/2008 | Santori |
| 2008/0108170 A1 | 5/2008 | Adkisson |
| 2008/0116537 A1 | 5/2008 | Adkisson |
| 2008/0128760 A1 | 6/2008 | Jun |
| 2008/0145965 A1* | 6/2008 | Reznik et al. ................. 438/72 |
| 2008/0149914 A1 | 6/2008 | Samuelson et al. |
| 2008/0149944 A1* | 6/2008 | Samuelson et al. ............ 257/88 |
| 2008/0157253 A1 | 7/2008 | Starikov |
| 2008/0166883 A1* | 7/2008 | Liu et al. .................... 438/761 |
| 2008/0169017 A1 | 7/2008 | Korevaar |
| 2008/0169019 A1 | 7/2008 | Korevaar |
| 2008/0173615 A1 | 7/2008 | Kim |
| 2008/0188029 A1 | 8/2008 | Rhodes |
| 2008/0191278 A1 | 8/2008 | Maekawa |
| 2008/0191298 A1 | 8/2008 | Lin |
| 2008/0211945 A1 | 9/2008 | Hong |
| 2008/0218740 A1 | 9/2008 | Williams |
| 2008/0224115 A1 | 9/2008 | Bakkers |
| 2008/0225140 A1 | 9/2008 | Raynor |
| 2008/0233280 A1 | 9/2008 | Blanchet |
| 2008/0237568 A1 | 10/2008 | Kobayashi |
| 2008/0246020 A1 | 10/2008 | Kawashima |
| 2008/0246123 A1 | 10/2008 | Kamins |
| 2008/0248304 A1 | 10/2008 | Hanrath |
| 2008/0251780 A1 | 10/2008 | Li |
| 2008/0258747 A1 | 10/2008 | Kluth |
| 2008/0260225 A1 | 10/2008 | Szu |
| 2008/0266556 A1 | 10/2008 | Kamins |
| 2008/0277646 A1 | 11/2008 | Kim |
| 2008/0283728 A1 | 11/2008 | Inoue |
| 2008/0283883 A1 | 11/2008 | Shim |
| 2008/0297281 A1 | 12/2008 | Ayazi |
| 2008/0311693 A1 | 12/2008 | Maxwell |
| 2008/0311712 A1 | 12/2008 | Anwat et al. |
| 2009/0001498 A1 | 1/2009 | Wang |
| 2009/0020150 A1 | 1/2009 | Atwater |
| 2009/0032687 A1 | 2/2009 | Lapstun |
| 2009/0046362 A1 | 2/2009 | Guo |
| 2009/0046749 A1 | 2/2009 | Mizuuchi |
| 2009/0050204 A1 | 2/2009 | Habib |
| 2009/0057650 A1 | 3/2009 | Lieber |
| 2009/0072145 A1 | 3/2009 | Peczalski |
| 2009/0121136 A1 | 5/2009 | Gruss |

(56) References Cited

U.S. PATENT DOCUMENTS

| | | |
|---|---|---|
| 2009/0127442 A1* | 5/2009 | Lee .................. 250/227.11 |
| 2009/0146198 A1 | 6/2009 | Joe |
| 2009/0151782 A1 | 6/2009 | Ko |
| 2009/0152664 A1 | 6/2009 | Klem |
| 2009/0153961 A1 | 6/2009 | Murakami et al. |
| 2009/0165844 A1* | 7/2009 | Dutta .................. 136/255 |
| 2009/0173976 A1 | 7/2009 | Augusto |
| 2009/0179225 A1* | 7/2009 | Fertig et al. .................. 257/184 |
| 2009/0179289 A1 | 7/2009 | Park |
| 2009/0188552 A1 | 7/2009 | Wang |
| 2009/0189144 A1 | 7/2009 | Quitoriano |
| 2009/0189145 A1 | 7/2009 | Want et al. |
| 2009/0199597 A1 | 8/2009 | Danley |
| 2009/0201400 A1 | 8/2009 | Zhang et al. |
| 2009/0206405 A1* | 8/2009 | Doyle et al. .................. 257/365 |
| 2009/0224245 A1 | 9/2009 | Umezaki |
| 2009/0224349 A1 | 9/2009 | Gambino |
| 2009/0230039 A1 | 9/2009 | Hoenig |
| 2009/0233445 A1 | 9/2009 | Lee |
| 2009/0243016 A1* | 10/2009 | Kawahara et al. .................. 257/435 |
| 2009/0244514 A1 | 10/2009 | Jin |
| 2009/0260687 A1* | 10/2009 | Park .................. 136/259 |
| 2009/0261438 A1 | 10/2009 | Choi |
| 2009/0266418 A1 | 10/2009 | Hu |
| 2009/0266974 A1 | 10/2009 | Verhulst |
| 2009/0272423 A1 | 11/2009 | Niira |
| 2009/0278998 A1* | 11/2009 | El-Ghoroury et al. ........ 348/744 |
| 2009/0289320 A1 | 11/2009 | Cohen |
| 2009/0305454 A1 | 12/2009 | Cohen |
| 2010/0006817 A1 | 1/2010 | Ohlsson et al. |
| 2010/0019252 A1 | 1/2010 | Bratkovski et al. |
| 2010/0019296 A1 | 1/2010 | Cha |
| 2010/0019355 A1 | 1/2010 | Kamins |
| 2010/0090341 A1 | 4/2010 | Wan |
| 2010/0101633 A1 | 4/2010 | Park |
| 2010/0104494 A1 | 4/2010 | Meng |
| 2010/0110433 A1 | 5/2010 | Nedelcu et al. |
| 2010/0116976 A1* | 5/2010 | Wober .................. 250/227.23 |
| 2010/0127153 A1 | 5/2010 | Agarwal |
| 2010/0132779 A1 | 6/2010 | Hong |
| 2010/0133986 A1 | 6/2010 | Kim et al. |
| 2010/0136721 A1 | 6/2010 | Song |
| 2010/0148221 A1 | 6/2010 | Yu |
| 2010/0163714 A1* | 7/2010 | Wober .................. 250/227.2 |
| 2010/0163941 A1 | 7/2010 | Jung |
| 2010/0178018 A1* | 7/2010 | Augusto .................. 385/131 |
| 2010/0186809 A1 | 7/2010 | Samuelson |
| 2010/0187404 A1 | 7/2010 | Klem |
| 2010/0200065 A1 | 8/2010 | Choi |
| 2010/0207103 A1 | 8/2010 | Farrow |
| 2010/0218816 A1 | 9/2010 | Guha |
| 2010/0229939 A1 | 9/2010 | Shen |
| 2010/0230653 A1* | 9/2010 | Chen .................. 257/4 |
| 2010/0237454 A1* | 9/2010 | Fujisawa .................. 257/443 |
| 2010/0244108 A1* | 9/2010 | Kohnke et al. .................. 257/292 |
| 2010/0244169 A1* | 9/2010 | Maeda et al. .................. 257/432 |
| 2010/0249877 A1 | 9/2010 | Naughton |
| 2010/0258184 A1 | 10/2010 | Laughlin |
| 2010/0276572 A1 | 11/2010 | Iwabuchi |
| 2010/0277607 A1 | 11/2010 | Choi |
| 2010/0282314 A1 | 11/2010 | Coakley |
| 2010/0295019 A1 | 11/2010 | Wang et al. |
| 2010/0302440 A1 | 12/2010 | Wober |
| 2010/0304061 A1* | 12/2010 | Ye et al. .................. 428/34.4 |
| 2010/0308214 A1 | 12/2010 | Wober |
| 2010/0320444 A1 | 12/2010 | Dutta |
| 2011/0018424 A1 | 1/2011 | Takada |
| 2011/0036396 A1 | 2/2011 | Jayaraman |
| 2011/0037133 A1* | 2/2011 | Su et al. .................. 257/432 |
| 2011/0050042 A1 | 3/2011 | Choi |
| 2011/0080508 A1* | 4/2011 | Katsuno et al. ............... 348/302 |
| 2011/0127490 A1 | 6/2011 | Mi |
| 2011/0133060 A1* | 6/2011 | Yu et al. .................. 250/214.1 |
| 2011/0133160 A1* | 6/2011 | Yu et al. .................. 257/14 |
| 2011/0135814 A1* | 6/2011 | Miyauchi et al. ............. 427/123 |
| 2011/0139176 A1* | 6/2011 | Cheung et al. .................. 134/1.2 |
| 2011/0146771 A1 | 6/2011 | Chuang |
| 2011/0147870 A1* | 6/2011 | Ang et al. .................. 257/432 |
| 2011/0180894 A1 | 7/2011 | Samuelson |
| 2011/0195577 A1* | 8/2011 | Kushibiki et al. .................. 438/714 |
| 2011/0226937 A1* | 9/2011 | Yu et al. .................. 250/216 |
| 2011/0248315 A1 | 10/2011 | Nam |
| 2011/0249219 A1 | 10/2011 | Evans |
| 2011/0249322 A1 | 10/2011 | Wang |
| 2011/0253982 A1 | 10/2011 | Wang et al. |
| 2011/0272014 A1 | 11/2011 | Mathai et al. |
| 2011/0297214 A1 | 12/2011 | Kim |
| 2011/0309237 A1* | 12/2011 | Seo et al. .................. 250/208.2 |
| 2011/0315988 A1* | 12/2011 | Yu et al. .................. 257/52 |
| 2011/0316106 A1* | 12/2011 | Kim .................. 257/432 |
| 2012/0009714 A1* | 1/2012 | Mouli .................. 438/57 |
| 2012/0014837 A1* | 1/2012 | Fehr et al. .................. 422/82.11 |
| 2012/0029328 A1 | 2/2012 | Shimizu |
| 2012/0075513 A1 | 3/2012 | Chipman et al. |
| 2012/0196383 A1 | 8/2012 | Nitkowski et al. ............ 436/501 |
| 2012/0196401 A1 | 8/2012 | Graham |
| 2012/0258563 A1* | 10/2012 | Ogino et al. .................. 438/69 |
| 2013/0020620 A1* | 1/2013 | Wober .................. 257/292 |
| 2014/0045209 A1* | 2/2014 | Chou et al. .................. 435/34 |

FOREIGN PATENT DOCUMENTS

| | | |
|---|---|---|
| JP | 359013708 A | 1/1984 |
| JP | 59198413708 | 1/1984 |
| JP | 2002151715 | 5/2002 |
| JP | 2005252210 | 9/2005 |
| JP | 2007201091 | 8/2007 |
| TW | 200845402 | 11/2008 |
| TW | 200915551 | 4/2009 |
| WO | 8603347 | 6/1986 |
| WO | 0002379 | 1/2000 |
| WO | 03107439 A1 | 12/2003 |
| WO | 2005064337 | 7/2005 |
| WO | 2008069565 | 6/2008 |
| WO | 2008079076 | 7/2008 |
| WO | 2008131313 | 10/2008 |
| WO | 2008135905 | 11/2008 |
| WO | 2008135905 A3 | 11/2008 |
| WO | 2008143727 | 11/2008 |
| WO | 2009116018 | 9/2009 |
| WO | 2009137241 | 11/2009 |
| WO | 2010019887 | 2/2010 |
| WO | 2010039631 | 4/2010 |

OTHER PUBLICATIONS

William Shockley and H. Queisser, Detailed Balance Limit of Efficiency of p-n Junction Solar Cells, J. of Appl. Physics, Mar. 1961, 32(3).

International Preliminary Report on Patentability for PCT International Application No. PCT/US2010/035722, mailed Nov. 3, 2011.

CMOS image sensor pixel microlens array optimization using FDTD Solutions, http://www.lumerical_com/ fdtd_microlens/cmos_image_sensor_pixel_microlens.php, pp. 1-2, Jun. 25, 2008.

"CMOS image sensor pixel optical efficiency and optical crosstalk optimization using FDTD Solutions" www.lumerical.com/fdtd_microlens/cmos_image_sensor_pixel_microlens.php, Mar. 19, 2009.

Adler, Nanowire Lawns Make for Sheets of Image Sensors, NewScientist.com, Jul. 28, 2008.

Babinec et al., High-Flux, Low-Power Diamond Nanowire Single-Photon Source Arrays: An Enabling Material for Optical and Quantum Computing and Cryptography, obtained on Jul. 22, 2010 at URL <http://otd.harvard.edu/technologies/tech.php?case=3702>.

Baillie et al., 'Zero-space microlenses for CMOS image sensors: optical modeling and lithographic process development', Publication Date May 2004, http://adsabs.harvard.edu/abs/2004SPIE.5377..953B, pp. 1-2.vbTab.

Barclay et al., Chip-Based Microcavities Coupled to NV Centers in Single Crystal Diamond, Applied Physics Letters, Nov. 12, 2009, vol. 95, Issue 19.

(56) References Cited

OTHER PUBLICATIONS

Brouri et al., Photon Antibunching in the Flurescence of Individual Colored Centers in Diamond, Optics Letters, Sep. 1, 2000, vol. 25, Issue 17.
Chung, Sung-Wook et al. Silicon Nanowire Devices. Applied Physics Letters, vol. 76, No. 15 (Apr. 10, 2000), pp. 2068-2070.
Deptuch et al., Vertically Integrated Circuits at Fermilab, IEEE Transactions on Nuclear Science, Aug. 2010, vol. 54, Issue 4, pp. 2178-2186.
Ekroll, On the Nature of Simultaneous Color Contrast, Dissertation, University of Kiel, 2005.
Fan et al., Large-Scale, Heterogeneous Integration of Nanowire Arrays for Image Sensor Circuitry, Proceedings of the National Academy of Sciences (PNAS) of the United States of America, Aug. 12, 2008, vol. 105, No. 32.
Fang et al., Fabrication of Slantingly-Aligned Silicon Nanowire Arrays for Solar Cell Applications, Nanotechnology, 2008, vol. 19, No. 25.
Furumiya, et al. "High-sensitivity and no-crosstalk pixel technology for embedded CMOS image sensor"; IEEE Electron Device Letters, vol. 48, No. 10, Oct. 2001.
Gadelrab et al., The Source-Gated Amorphous Silicon Photo-Transistor, IEEE Transactions on Electron Devices, Oct. 1997, vol. 44, No. 10, pp. 1789-1794.
Gambino et al., 'CMOS Imager with Copper Wiring and Lightpipe,' Electron Devices Meeting, 2006. IEDM '06, International Publication Date: Dec. 11-13, 2006, pp. 1-4.
Garnett et al., Light Trapping in Silicon Nanowire Solar Cells, Nanoletters, Jan. 28, 2010, vol. 10, No. 3, pp. 1082-1087.
Ge et al., Orientation-Controlled Growth of Single-Crystal Silicon-Nanowire Arrays, Advanced Materials, Jan. 18, 2005, vol. 17, No. 1, pp. 56-61.
Guillaumée, et al., Polarization Sensitive Silicon Photodiodes Using Nanostructured Metallic Grids, Applied Physics Letters 94, 2009.
Hanrath et al., Nucleation and Growth of Germanium Nanowires Seeded by Organic Monolayer-Coated Gold Nanocrystals, J. Am. Chem. Soc., Feb. 20, 2002, vol. 124, No. 7, pp. 1424-1429.
Hanrath et al., Supercritical Fluid-Liquid-Solid (SFLS) Synthesis of Si and Ge Nanowires Seeded by Colloidal Metal Nanocrystals, Advanced Materials, Mar. 4, 2003, vol. 15, No. 5, pp. 437-440.
Hochbaum et al., Controlled Growth of Si Nanowire Arrays for Device Integration, Nano Letters, Mar. 2005, vol. 5, No. 3, pp. 457-460.
Holmes et al., Control of Thickness and Orientation of Solution-Grown Silicon Nanowires, Science, Feb. 25, 2000, vol. 287, No. 5457, pp. 1471-1473.
International Preliminary Report on Patentability for PCT International Patent Application No. PCT/U62009/055963, mailed Mar. 17, 2011.
International Search Report and Written Opinion for PCT International Application No. PCT/US2010/035722, mailed Jul. 20, 2010.
International Search Report and Written Opinion for PCT International Application No. PCT/US2010/035726, mailed Jul. 21, 2010.
International Search Report and Written Opinion for PCT International Application No. PCT/US2010/057227, mailed Jan. 26, 2011.
International Search Report and Written Opinion for PCT International Patent Application No. PCT/US2009/055963, mailed Oct. 15, 2009.vbTab.
International Search Report and Written Opinion for PCT International Patent Application No. PCT/US2009/063592, mailed Jan. 13, 2010.
International Search Report and Written Opinion for PCT International Patent Application No. PCT/US2010/035727, mailed Sep. 27, 2010.
International Search Report and Written Opinion for PCT International Patent Application No. PCT/US2010/051435, mailed Dec. 3, 2010.
International Search Report and Written Opinion for PCT International Patent Application No. PCT/US2010/051446, mailed Jan. 3, 2011.
International Search Report and Written Opinion for PCT International Patent Application No. PCT/US2010/059468, mailed Feb. 11, 2011.
International Search Report and Written Opinion for PCT International Patent Application No. PCT/US2010/059491, mailed Feb. 9, 2011.
International Search Report and Written Opinion for PCT International Patent Application No. PCT/US2010/059501, mailed Feb. 15, 2011.
International Search Report and Written Opinion for PCT International Patent Application No. PCT/US2010/059504, mailed Apr. 7, 2011.
Juan et al., High Aspect Ratio Polymide Etching Using an Oxygen Plasma Generated by Electron Cyclotron Resonance Source, Journal of Vacuum Science and Technology, Jan./Feb. 1994, vol. 12, No. 1., pp. 422-426.
Junger, et. al., Polarization- and wavelength-sensitive sub-wavelength structures fabricated in the metal layers of deep submicron CMOS processes, Proc. of SPIE, vol. 7712, 2010.
Kalkofen et al., Atomic Layer Deposition of Boron Oxide As Dopant Source for Shallow Doping of Silicon, Meeting Abstact 943, 217th ECS Meeting, MA2010-01 ,Apr. 25-30, 2010, Vancouver Canada, El—Advanced Gate Stack, Source / Drain, and Channel Engineering for Si-Based CMOS 6: New Materials, Processes, and Equipment.
Kane, Why Nanowires Make Great Photodetectors, EurekAlert.com article, Apr. 25, 2007.
Kempa, Thomas J. et al. Single and Tandem Axial p-i-n. Nanowire Photovoltaic Devices. Nano Letters. 2008, vol. 8, No. 10, 3456-3460.
Kim et al., Electronic Structure of Vertically Aligned Mn-Doped CoFe2O4 Nanowires and Their Application as Humidity Sensors and Photodetectors, Journal of Physical Chemistry C, Apr. 7, 2009.
Law, et al., 'Semiconductor Nanowires and Nanotubes'; Annu. Rev. Mater. Res. 2004, 34:83-122.
Lee et al., Vertical Pillar-Superlattice Array and Graphene Hybrid Light Emitting Diodes, Nano Letters, 2010, vol. 10, pp. 2783-2788.
Lin et al., Fabrication of Nanowire Anisotropic Conductive Film for Ultra-fine Pitch Flip Chip Interconnection, Electronic Components and Technology Conference, Jun. 20, 2005, 55th Proceedings, pp. 66-70.
Lin et al., Reducing Dark Current in a High-Speed Si-Based Interdigitated Trench-Electrode MSM Photodetector, IEEE Transactions on Electron Devices, May 2003, vol. 50, No. 5, pp. 1306-1313.
Loncar et al., Diamond Nanotechnology, SPIE Newsroom, May 18, 2010, obtained at url: <http://spie.org/x40194.xml?ArticleID=x40194>.
Loose et al., CMOS Detector Technology, Scientific Detector Workshop, Sicily, 2005, Experimental Astronomy, vol. 19, Issue 1-3, pp. 111-134.
Lu et al., Growth of Single Crystal Silicon Nanowires in Supercritical Solution from Tethered Gold Particles on a Silicon Substrate, NanoLetters, Jan. 2003, vol. 3, No. 1, pp. 93-99.
Lugstein et al., Ga/Au Alloy Catalyst for Single Crystal Silicon-Nanowire Epitaxy, Applied Physics Letters, Jan. 8, 2007, vol. 90, No. 2, pp. 023109-1-023109-3.
Madou, Properties and Growth of Silicon, Including Crystalline Silicon, Fundamentals of Microfabrication, 2nd Ed., CRC Press, 2002, pp. 125-204.
Makarova et al., Fabrication of High Density, High-Aspect-Ratio Polyimide Nanofilters, Journal of Vacuum Science and Technology, Nov./Dec. 2009, vol. 27, No. 6., pp. 2585-2587.
Morales et al., A Laser Ablation Method for the Synthesis of Crystalline Semiconductor Nanowires, Science, Jan. 9, 1998, vol. 279, pp. 208-211.
N.L. Dmitruk, et al.; 'Modeling and Measurement of Optical Response of 1D Array of Metallic Nanowires for Sensing and Detection Application'; 26th International Conference on Microelectronics (MIEL 2008), NIS, Serbia, May 11-14, 2008.
Nguyen et al., Deep Reactive Ion etching of Polyimide for Microfluidic Applications, Journal of the Korean Physical Society, Sep. 2007, vol. 51, No. 3, pp. 984-988.
Pain et al., A Back-Illuminated Megapixel CMOS Image Sensor, IEEE Workshop on Charge-Coupled Devices and Advanced Image

(56) References Cited

OTHER PUBLICATIONS

Sensors, Karuizawa, Japan, Jun. 9-11, 2005, Jet Propulsion Laboratory, National Aeronautics and Space Administration, Pasadena California.
Parraga et al., Color and Luminance Information in Natural Scenes, Journal of Optical Society of America A, Optics, Image, Science and Vision, Jun. 1998, vol. 15, No. 6.
Rosfjord et al., Nanowire Single-Photon Detector with an Integrated Optical Cavity and Anti-Reflection Coating, Optics Express: The International Electronic Journal of Optics, Jan. 23, 2006, vol. 14, No. 2, pp. 527-534.
Rugani, First All-Nanowire Sensor, Technology Review, Aug. 13, 2008, Published by MIT.
Rutter, Diamond-Based Nanowire Devices Advance Quantum Science, SEAS Communications, Feb. 14, 2010, obtained at url:<http://news.harvard.edu/gazette/story/2010/02/digging-deep-into-diamonds/>.
Schmidt et al., Realization of a Silicon Nanowire Vertical Surround-Gate Field-Effect Effect Transistor, Small, Jan. 2006, vol. 2, No. 1, pp. 85-88.
Song et al., Vertically Standing Ge Nanowires on GaAs(110) Substrates, Nanotechnology 19, Feb. 21, 2008.
T. H. Hsu, et al. 'Light Guide for Pixel Crosstalk Improvement in Deep Submicron CMOS Image Sensor'; IEEE Electron Device Letters, vol. 25, No. 1, Jan. 2004.
Thelander et al., Nanowire-Based One-Dimensional Electronics, Materials Today, Oct. 2006, vol. 9, No. 10, pp. 28-35.
Trentler, Timothy J. et al. Solution-Liquid-Solid Growth of Cyrstalline III-V Semiconductors: An Analogy to Vapor Liquid-Solid Growth. vol. 270(5243), Dec. 15, 1995, pp. 1791-1794.
Tseng, et al. 'Crosstalk improvement technology applicable to 0.14μm CMOS image sensor'; IEEE International Electron Devices Meeting, Dec. 13-15, 2004; IEDM Technical Digest, pp. 997-1000. vbTab.
Verheijen, Marcel A. et al. Growth Kinetics of Heterostructured GaP-GaAs Nanowires. J. Am. Chem. Soc. 2006, 128, 1353-1359.
Wagner, R.S. and Ellis, W.C. Vapor-Liquid-Solid Mechanism of Single Crystal Growth. Applied Physics Letters. vol. 4, No. 5 (Mar. 1, 1964), pp. 89-90.
Wong et al., Lateral Nanoconcentrator Nanowire Multijunction Photovoltaic Cells, GCEP Progress report, Apr. 20, 2009, pp. 1-18.
Zhang et al., Ultrahigh Responsivity Visible and Infrared Detection Using Silicon Nanowire Phototransistors, Nanoletters, May 14, 2010, vol. 10, No. 6, pp. 2117-2120.
Ye et al., Fabrication Techniques of High Aspect Ratio Vertical Lightpipes Using a Dielectric Photo Mask, SPIE, Proceedings, Feb. 2010, vol. 7591.
International Search Report and Written Opinion for PCT International Patent Application No. PCT/US2011/060348, mailed Mar. 9, 2012.
International Search Report and Written Opinion for PCT International Patent Application No. PCT/US2011/064635, mailed Apr. 13, 2012.
International Search Report and Written Opinion for PCT International Patent Application No. PCT/US2011/066097, mailed Mar. 12, 2012.
International Search Report and Written Opinion for PCT International Patent Application No. PCT/US2011/067712, mailed May 3, 2012.
Baomin Wang and Paul W. Leu, Nanotechology 23 (2012) 194003, 7 pages.
Sangmoo Jeon, et al., Nano Lett. 2012, 12, 2971-2976.
Sangmoo Jeong et al., J. Vac. Sci. Technol. A 30(6), Nov./Dec. 2012.
Sarkar et. al., Integrated polarization-analyzing CMOS image sensor for detecting incoming light ray direction, Sensors Application Symposium (SAS), Mar. 29, 2012, p. 194-199, 1010 IEEE.
Jin-Kon Kim; 'New Functional Nanomaterials Based on Block Copolymers' http://www.ziu.edu.cn/adver/subjectizyhd/jz0707061313.html, Jul. 7, 2011.
Ozgur Yavuzcetin, et al.; 'Index-tuned Anti-reflective Coating using a Nanostructured Metamaterial'; http://www.umass.edu/research/rld/bioportal/vuewlech.php?tid=40, Feb. 28, 2007.
Reynard Corporation; 'Anti-Reflection Coatings (AR)', http://www.reynardcorp.com/coating_anti_reflection.php, undated.
Shimizu et al., Homoepitaxial Growth of Vertical Si Nanowires on Si(100) Substrate using Anodic Aluminum Oxide Template, (abstract only), Materials Research Society, Fall 2007.
Wang, Introduction to Nanotechnology—Where Opportunities arise & Great Future Being Built from Small Things, Fall 2008.
International Preliminary Search Report on Patentability of PCT/US201-057325, mailed May 2, 2013.
International Preliminary Report and Written Opinion re PCT/US2010/059491, mailed Jun. 21, 2012.
International Search Report and Written Opinion re PCT/US2011/57325, mailed Jun. 22, 2012.
International Preliminary Report and Written Opinion re PCT/US2010/059468, mailed Jun. 21, 2012.
International Preliminary Report and Written Opinion re PCT/US2010/059504, mailed Jun. 21, 2012.
International Preliminary Report and Written Opinion re PCT/US2010/059496, mailed Jun. 21, 2012.
U.S. Office Action for U.S. Appl. No. 12/573,582, dated Jun. 28, 2012.
U.S. Office Action for U.S. Appl. No. 13/494,661, notification date Nov. 7, 2012.
Taiwanese Office Action of Taiwan Patent Application No. 099116881, issued Jul. 18, 2013 (8 pages).
Canadian Office Action of Canadian Application No. 3,676,376, dated Oct. 11, 2013.
Catrysse, et al., An Integrated Color Pixel in 0.18pm CMOS Technology, Proceedings IEDM 2001, pp. 559-562.
Choi et al., Optimization of sidewall roughness in silica waveguides to reduce propagation losses, May 2001, Lasers and Electro-Optics, 2001. CLEO '01. Technical Digest. Summaries of papers presented at the Conference on, pp. 175-176.
Geyer et al., Model for the Mass Transport during Metal-Assisted Chemical Etching with Contiguous Metal Films as Catalysts, J. Phys. Chem. C 2012, 116, 13446-13451.
Hopkins, Addressing sidewall roughness using dry etching silicon and Si02, Jul. 1, 2004, ElectrolQ, vol. 47, Issue 7.
Mei-Ling Kuo et al. "Realization of a near-perfect antireflection coating for silicon solar energy utilization" (Nov. 1, 2008, vol. 33, No. 21, Optics Letters).
Mukhopadhyay, When PDMS Isn't the Best, American Chemical Society, May 1, 2007.
Seo, et. al., "Multicolored vertical silicon nanowires," Nano Letters, vol. 11 issue 4, pp. 1851-1856, 2010.
U.S. Final Office Action for U.S. Appl. No. 12/966,514, mailed Mar. 19, 2013, 50 pages.
U.S. Final Office Action for U.S. Appl. No. 13/494,661, mailed Mar. 7, 2013, 10 pages.
U.S. Office Action for U.S. Appl. No. 12/633,313, dated Aug. 1, 2013, 20 pages.
U.S. Office Action for U.S. Appl. No. 12/966,514, dated Aug. 15, 2013, 17 pages.
U.S. Office Action for U.S. Appl. No. 12/966,535, mailed Jun. 14, 2013, 22 pages.
U.S. Office Action for U.S. Appl. No. 12/966,573, dated Aug. 6, 2013, 13 pages.
U.S. Office Action for U.S. Appl. No. 13/048,635, mailed Jun. 6, 2013, 24 pages.
Office Action issued on Jan. 28, 2014 in Taiwanese Application No. 100146327.
Office Action issued on Mar. 17, 2014 in Korean Application No. 10-2013-7018243.
U.S. Office Action for U.S. Appl. No. 12/910,664, mailed Feb. 26, 2014.
U.S. Office Action for U.S. Appl. No. 12/966,514, mailed Feb. 25, 2014.
U.S. Office Action for U.S. Appl. No. 12/945,492 mailed May 13, 2014.

* cited by examiner

The distance between electrodes is 5 μm

SILICON NITRIDE LIGHT PIPES FOR IMAGE SENSORS

DOMESTIC PRIORITY INFORMATION

This application claims the benefit of U.S. Provisional Application No. 61/360,421, filed on Jun. 30, 2010, which is hereby incorporated by reference as if fully set forth herein.

CROSS-REFERENCE TO RELATED APPLICATIONS

This application is related to U.S. patent application Ser. Nos. 12/204,686 (granted as U.S. Pat. No. 7,646,943), 12/648,942, 12/270,233, 12/472,264, 12/472,271, 12/478,598, 12/573,582, 12/575,221, 12/633,323, 12/633,318, 12/633,313, 12/633,305, 12/621,497, 12/633,297, 61/266,064, 61/357,429, 61/306,421, 61/306,421, 12/910,664 and 12/910664, the disclosures of which are hereby incorporated by reference in their entirety.

FIELD

This application generally relates to semiconductor sensing devices and manufacturing, and in particular, silicon nitride light pipes for image sensors.

BACKGROUND

Recently, there has been an increasing trend toward the use of image sensors based on complementary metal oxide semiconductor (CMOS), rather than charged coupled device (CCD), technology. Advantages of CMOS image sensors include low power usage, compatibility with CMOS logic technology, permitting random access of image data, and circuit integration. In conventional CMOS image sensors, however, increasing circuit complexity may be detrimental to optical performance. As the number of metal interconnect layers increases, so does the distance between the microlenses and photodiodes, reducing light collection efficiency and increasing inter-pixel cross-talk.

Thus, an improved CMOS image sensor is desired.

SUMMARY

According to an embodiment, a method comprises: forming an etch mask on a silicon nitride layer provided on a wafer; and etching a sidewall in the silicon nitride layer to form a pillar. In some implementations, the pillar may be integrated with a photodiode element on the wafer.

According to an embodiment, an etched pillar consists of silicon nitride. The pillar may be configured as a lightpipe.

According to an embodiment, an image sensing device comprises: a photodetector element; and a pillar of silicon nitride formed on the photodetector element.

According to an embodiment, a method for fabricating a photodiode comprises: forming an etch mask on a silicon-on-insulator (SOI) wafer so as to define a region; etching the SOI wafer to form a trench at least partially around the region in an insulating layer of the SOI wafer, and depositing dopants in the region.

According to an embodiment, a device comprises: a photodiode formed on a silicon-on-insulator (SOI) wafer, wherein the photodiode is electrically isolated by the trench formed in an insulator layer of the SOI wafer.

Other features of one or more embodiments of this disclosure will seem apparent from the following detailed description, and accompanying drawings, and the appended claims.

BRIEF DESCRIPTION OF THE DRAWINGS

Embodiments of the present disclosure will now be disclosed, by way of example only, with reference to the accompanying schematic drawings in which corresponding reference symbols indicate corresponding parts, in which.

DETAILED DESCRIPTION

Figure 2:
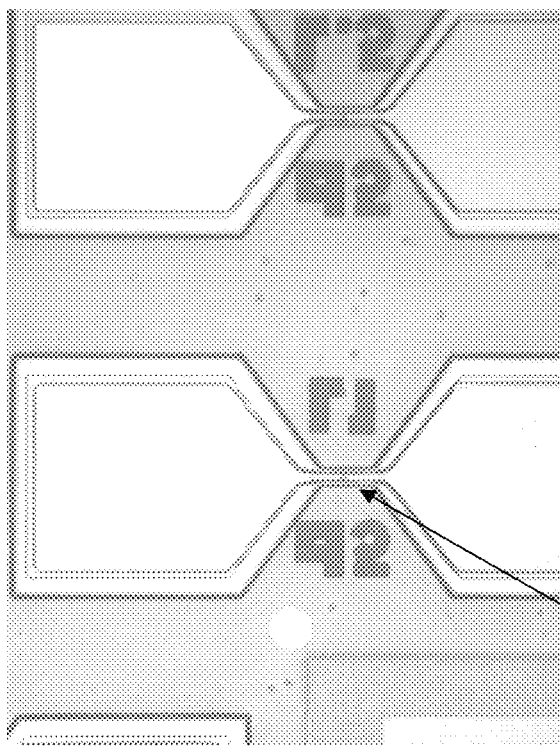
FIG. 2 shows an optical microscope image of the photodetectors after n+ and p+ doping.

In the following detailed description, reference is made to the accompanying drawings, which form a part thereof. In the drawings, similar symbols typically identify similar components, unless the context dictates otherwise. The illustrative embodiments described in the detail description, drawings, and claims are not meant to be limiting. Other embodiments may be utilized, and other changes may be made, without departing from the spirit or scope of the subject matter presented here.

This disclosure is drawn to, among other things, methods, apparatuses, systems, and devices relating to improving the performance of CMOS image sensors using vertical optical waveguides, known as light pipes.

Various embodiments for etching of silicon nitride lightpipes, optical waveguides and pillars, fabricating photodiode elements, and integration of the silicon nitride elements with photodiode elements are described. The results show that the quantum efficiency of the photodetectors (PDs) can be increased using vertical silicon nitride vertical waveguides.

A "light pipe," as used herein, is an optical device for confining and transmitting electromagnetic radiation over its length. Light pipes may be used in solid state image sensor devices to confine and transmit electromagnetic radiation impinging thereupon to the photosensitive elements or other electromagnetic radiation detecting elements formed on an underlying substrate layer. The image sensor may be configured to detect electromagnetic radiation, such as infrared (IR), visible, and/or ultraviolet (UV) light. These structures may significantly improve the light collection efficiency and reduce the scattering and crosstalk losses in the dielectric layer. In one implementation, "light pipes" may be configured as vertical waveguides formed in the intermetal dielectric region between the microlenses and photodiodes of a CMOS image sensor, such as disclosed in U.S. Pat. No. 7,646,943, herein incorporated by reference in its entirety.

According to an embodiment, one or more features, such as pillars, may be formed in a silicon nitride layer to define one or more light pipes or other features. The silicon nitride layer may be formed upon a wafer or substrate, for example, comprised of crystalline silicon. Well-controlled shaped pillars with vertical sides walls may be fabricated.

Silicon nitride may have the general formula ($Si_xN_y$). In some instances, the silicon nitride may have the formula ($Si_3N_4$).

The pillars may be circular in cross-section, although other shaped pillars are also possible. For example, the pillars may have a diameter of about 4 μm or more, and a height of about 8 μm or more. Pillars having smaller diameters and/or heights may also be fabricated, if desired.

The pillars may be fabricated by an etching process using an etch mask as a template or pattern using contact lithography. More specifically, the etch mask defines the sidewalls of the pillars, provides excellent dry etch resistance, and/or enables an easy lift-off process on the etch mask from the silicon nitride layer. Embodiments for fabricating features are disclosed herein which produce high aspect ratio pillars, having generally vertical and smooth sidewalls.

The term "aspect ratio," as used herein, may be defined as the ratio of the height of a particular feature to its width (or diameter). For example, according to one or more embodiments, features may be produced having a high aspect ratio of at least about 3.0:1. The sidewalls of features be fabricated to have high verticality and smoothness, for instance, with each sidewall having a sidewall angle at least 70°, and more preferably greater than about 88°, and having a sidewall surface roughness ($\sigma_{RMS}$) of about a few nanometers (e.g., about 50 nm or less, or about 5 nm or less). As such, smooth, clean high aspect ratio features may be produced, which are substantially free of debris.

One exemplary method is discussed, below, for fabricating one or more photoreceptors according to an embodiment.

The one or more photodiodes may be in the form of lateral p-i-n structures. The starting substrate may be a silicon-on-insulator (SOI) wafer with a [100] crystal orientation. The SOI wafer may, for instance, be comprised of a top layer that is a P-type doped Si layer, 4 μm thick, lightly doped with a resistivity of 1000 ohm-cm; and insulator layer that is $SiO_2$, 1 μm thick; and an underlying substrate that is a 500 μm thick [100] Si wafer.

A very thin $Si_3N_4$ layer, such as, for example, 40 nm in thickness, may be deposited on a silicon wafer for passivation. Alignment markers are defined using a reactive ion etching process. For instance the alignment markers may be in the form of trenches to a depth of approximately 4 μm. In this etching process, tetrafluoromethane ($CF_4$) and argon (Ar) gases may be used as etching gases in RIE plasma processing.

In one or more of the lithography steps for the photodiode fabrication, discussed below, a Shipley 1813 photoresist with a thickness of approximately 1.3 μm, or a SU-8 photoresist with a thickness of 2 μm may be used. Of course, it will be appreciated that other photoresist types may be used.

The photoresist is then exposed to a pattern using contact lithography. The pattern defines the features which are to be subsequently formed. The photoresist patterning may be performed using vacuum contact or hard contact lithography, or other patterning process. For example, a resolution of approximately 1 μm can be obtained by vacuum contact machine (such as, for example, Karluss MJB3 and MJB4 mask aligner system). For high resolution lithography, a 1 inch square sample size may be used to make sure that the mask surface is parallel to the sample surface.

In a second mask step, feature (mesa) isolation may be performed by etching patterns around what will be the photodiode. This may be performed, for instance, using SU8 2002 resist by etching 4.2 μm deep which is in the middle of the $SiO_2$ layer. This step electrically separates adjacent photodiodes. The etch depth may be selected to ensure that the etched features penetrate into the $SiO_2$ layer. To ensure that the SU8 resist can readily be removed, MicroChem Corp. OmniCoat™ resist may be used.

Figure 1:
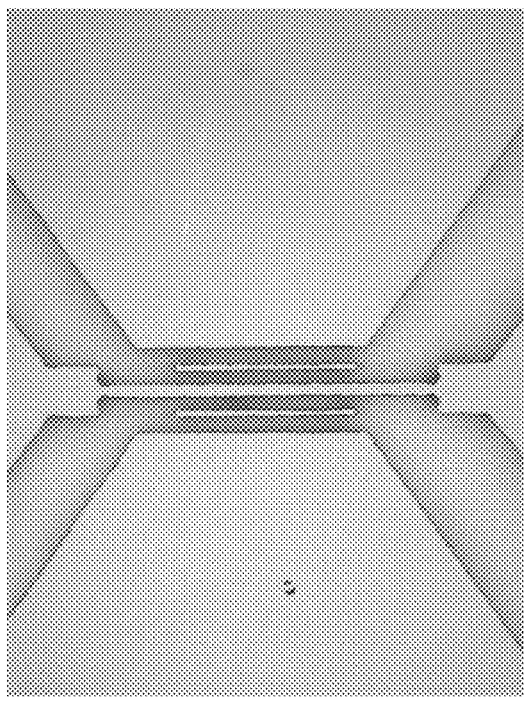
FIG. 1 shows an optical microscope image of the mesa isolation step using trenches in the Si layer into the $SiO_2$ isolation spacer over the Si substrate wafer.

FIG. 1 shows an optical microscope image of the mesa isolation step using trenches in the Si layer into the $SiO_2$ isolation spacer over the Si substrate wafer. The width of the middle mesa is 4 μm.

The inventors have found that for bake temperature of 100° C., it can be very difficult to lift off the SU8 resist. In order to solve this problem, oxygen plasma may be used in a reactive-ion etching process (RIE) followed by a HF dip to remove any oxide formed during the oxygen plasma process.

Next, p+ and n+ type doped regions may be formed by a diffusion process. This process may be performed, for instance, in a furnace heated at a temperature of greater than 900° C., using $SiO_2$ and silicon nitride masks. For example, an industrial furnace manufactured by Lindberg/MPH may be used.

In some implementations, borosilica and phosphorosilica dopant sources, for example, can be used as p– and n–type dopants, respectively. The fabrication process is as follows.

First, a thin silicon nitride layer may be deposited to be used as a dopant mask. The silicon nitride layer may be 100 nm in thickness. N+ doping regions may be defined by lithography. This may be performed, for example, by patterning a Shipley S1813 resist. The resist may be spun-on with a spin rate of be about 4,000 revolutions per minute (rpm) and have a bake temperature of 115° C. for 1 min.

The $Si_3N_4$ layer then may be etched by a RIE etching machine (such as, manufactured by Nexx Systems) to define the dopant regions. During the process, about 0.1 μm of the underlying silicon layer is also etched.

Afterwards, the dopant may be applied. For instance, a spin on doping method may be used for applying the n+ dopant. The wafer covered with $Si_3N_4$ can be spun with the borosilica solution and baked at 200° C. for 15 minutes. In one example, wafers to doped may be placed on a plain Si wafer, and then the wafer with doping material on top can be placed on top of the wafers, with spacer wafers between the two Si wafers. This arrangement may then be placed into the furnace, heated at about 950° C. for 15 minutes. Then the wafers can be taken out of the oven and the top Si wafer removed. The remaining structures may be further annealed for approximately 15 minutes more. Subsequently, the wafers can be cleaned in a diluted solution, such as hydrofluoric acid (HF), to remove any borosilicate glass which may have formed on the silicon surface while it is in the furnace.

This doping procedure may be repeated for the n–type dopant using a phosphorosilica solution in an analogous manner.

FIG. 2 shows an optical microscope image of the photodetectors after the n+ and p+ doping process steps via diffusion. The distance between the electrodes is 5 μm.

A variety of photodiode structures can be formed, for example, having active region diameters ranging from about 2 to 5 µm. Electrical connections to the photodiodes can then be defined. In one implementation this may be performed by lithography, followed by metal evaporation (100 Å/500 Å: Cr/Au) and lift-off in acetone (or other solvent) with ultrasonic agitation for about one minute.

Figure 3:
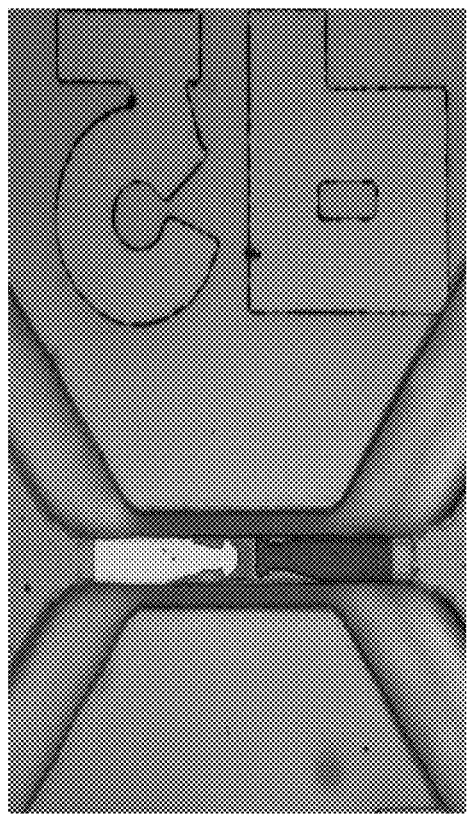
FIG. 3 shows an optical microscope image of the completed photodetectors after metallization.

FIG. 3 shows an optical microscope image of completed photodetectors after metallization with thermal evaporation of aluminum. The symbols on the right side of the images are for identification of structure. Thermal annealing of the metallization may be carried out at 450° C. for 40 seconds in a furnace in order to obtain ohmic contacts.

One exemplary method is discussed, below, for fabricating one or more silicon nitride pillars and integration the pillars with photodetectors according to an embodiment.

A waveguide core is silicon nitride, and the surround cladding material may be silicon dioxide. To form this structure, one could deposit a layer of silicon dioxide, etch a cylindrical hole into it, and the deposit $Si_xN_y$ to fill the hole. This approach has been previously demonstrated and found successful. See, e.g., W. N. Ye, P. Duane, M. Wober, K. B. Crozier, "Fabrication Techniques of High Aspect Ratio Vertical Lightpipes Using a Dielectric Photo Mask", Proc. SPIE, 7591, 75910D-75910D-8, 2010, herein incorporated by reference in its entirety. This process, though, imposes stringent requirements on the silicon nitride deposition step being extremely conformal.

Figure 4:
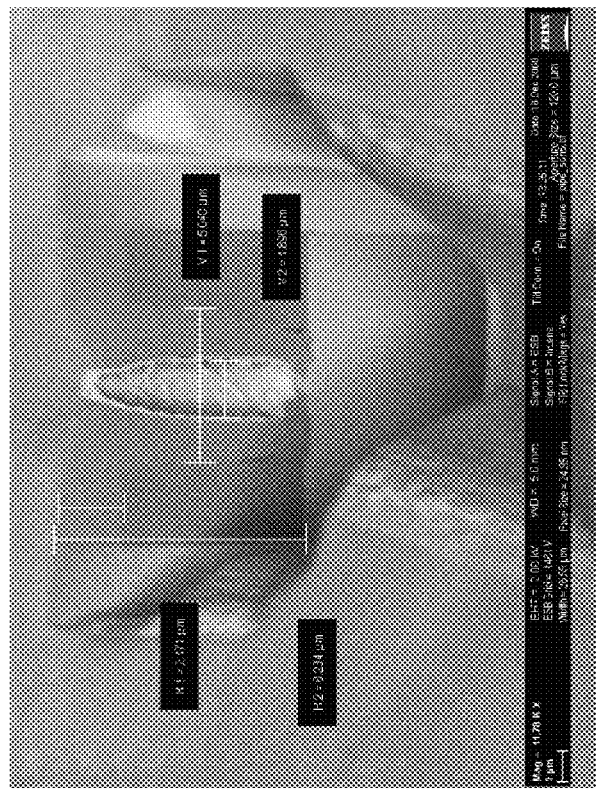
FIG. 4 shows a scanning electron microscope (SEM) image of a cylindrical hole opened in a thick $SiO_2$ layer.

FIG. 4 shows a scanning electron microscope (SEM) image of a cylindrical hole opened in thick $SiO_2$ layer into which silicon nitride is deposited. The figure shows the non-conformal deposition of silicon nitride leaving a "keyhole-shape" feature in the pipe region closing the mouth of the hole. This configuration was not found practical.

In an embodiment, a method for fabricating one or more silicon nitride pillar light pipes with a light blocking aluminum (Al) shadow layer underneath is described.

First, a thin layer of silicon nitride (e.g., 100 nm) may be deposited on top of one or more photodetector elements (which have been previously fabricated as discussed above). This prevents shorting of the photodiodes from metal films later deposited on the device. This step should be performed very carefully so as to not form any defects or voids (such as "pin holes"), because these defects can lead to short circuits when they coincide with the interconnects and the aluminum shadow layer. In some instances, applying the metallization layer in multiple layers may ameliorate this problem.

Next, a blocking region may be defined with lithography on the region around what is to become a pillar, which will block the light which is incident on the detector around the pillar. For example, 70 nm of aluminum metal or 70 nm of chromium metal may be deposited and then lifted off to define a shadow mask.

A layer of silicon nitride is then deposited. In one implementation, 8 µm of silicon nitride may be deposited on the thin layer of $Si_xN_y$ (e.g. $Si_3N_4$) previously applied to the photodetectors. In one implementation, the silicon nitride may be deposited using a PECVD process.

Next, an etch mask may be deposited over the silicon nitride. For instance, about 500 Å of aluminum may be deposited as an etch mask to define the shape and size of the pillar (e.g., a 5 µm diameter silicon nitride cylindrical pillar). Other shapes and sizes for the pillars are also possible. The etch mask may be applied using a thermal evaporator.

An etching process is then performed to form one or more pillars in the silicon nitride layer. For example, reactive ion etching (RIE) technology may be employed. In one implementation, a RIE tool manufactured by Surface Technology Systems might be used for performing the etching.

In order to etch the silicon nitride, one or more etching gases can be introduced into the RIE chamber to provide to provide vertical sidewall etching of the silicon nitride. In one embodiment, a mixture of sulfur hexafluoride ($SF_6$), octafluorocyclobutane ($C_4F_8$) and oxygen ($O_2$) gases, can be used.

The $SF_6$ gas is responsible for the isotropic etching. It also increases the $Si_xN_y$ etch rate and the roughness of the pillar sidewalls and of the bottom surface. The $C_4F_8$ gas is responsible for the formation of polymers and it enhances the smoothness of the sidewalls and the bottom surface (although, it may decrease the etch rate to some extent). It also promotes the anisotropic etching in the $Si_xN_y$ layer.

The $O_2$ gas is added to help remove polymers that may be formed during the etching process on the sidewalls of the pillars. The polymer forms during the etching process and should be removed since it can cause micro-masking (which is not repairable). Moreover, the polymer severely increases the roughness at the bottom surface of the silicon nitride layer.

The inventors have determined that the etch rate depends on a number of factors, such as, for example, the diameter of the pillars, the distance between the pillars, gases used, flow rates of the gases and the pressure in the etching chamber, the coil and radio-frequency (RF) powers, etc.

The inventors performed "design of experiments," using a commercial software package, Sentaurus Technology Computer-Aided Design (TCAD), produced by Synopsys Inc. This technique helps plan and conduct experiments and analyze the resulting data so that valid and objective conclusions can be obtained. The goals of the experiments were to ensure (1) a high selectivity (i.e., the rate at which the silicon nitride layer is etched relative to the etch mask); and (2) a high etch rate of the silicon nitride layer; and (3) high verticality of the sidewalls of the features.

In particular, the inventors conducted various experimental to find a balance of the etching gases, e.g., $C_4F_8$ and $SF_6$, to achieve vertical silicon nitride pillars.

For gas ratios ($C_4F_8/SF_6$) larger than 1.0, a $C_4F_8$ gas flow of 150 sccm is used. For gas ratios smaller than 1.0, an $SF_6$ gas flow of 130 sccm is used. Chamber pressure is 10 mTorr, the coil power is 1200 Watts, and the platen power is 12 Watts in the RIE system.

Figure 5:
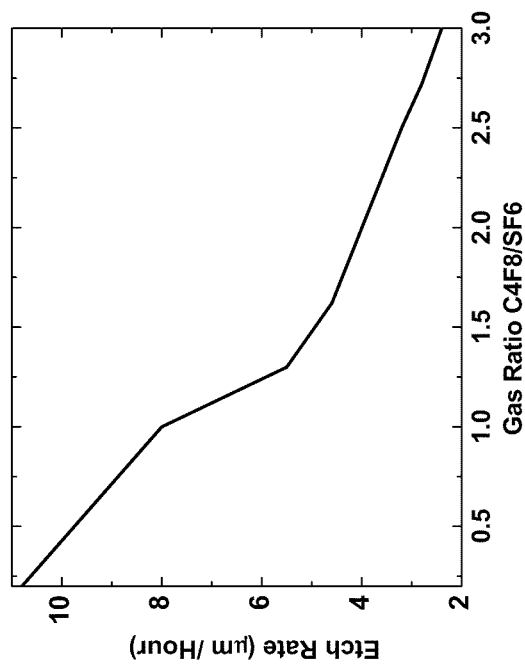
FIG. 5 is a plot illustrating the etch rate of the silicon nitride as a function of the etchant gas ratio in the RIE plasma.

FIG. 5 is a plot illustrating the etch rate of the silicon nitride as a function of the etchant gas ratio in the RIE plasma. The plot shows that, as the ratio of the $C_4F_8$ to $SF_6$ gases increases, there is a general decline in the etch rate of the silicon nitride.

Figure 6:
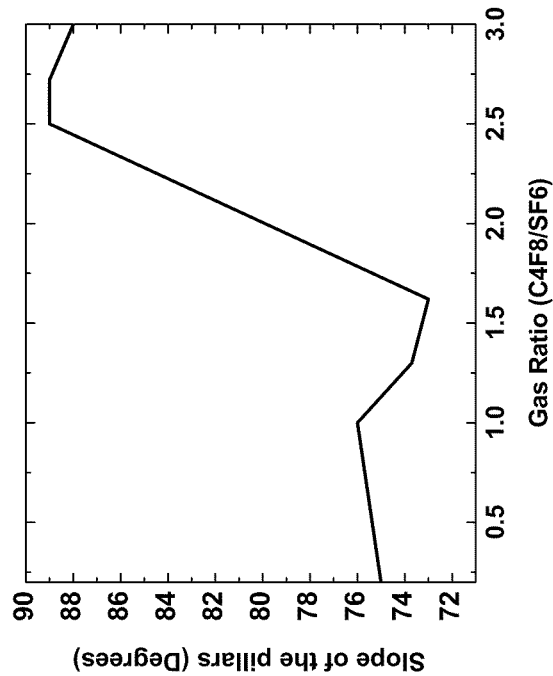
FIG. 6 is a plot illustrating the slope of the pillar walls etched with the horizontal plane as a function of the etchant gas ratio in the RIE plasma.

FIG. 6 is a plot illustrating the slope of the pillar walls etched with the horizontal plane as a function of the etchant gas ratio in the RIE plasma. The plot shows the gas ratio versus the angle of the nitride pillar walls make with the horizontal plane. Between a ratio of about 1.5 to 2.5 of the $C_4F_8$ to $SF_6$ gases, there is a large ramp-up in the angle of the pillars, to more than 88°.

Once etching is completed, the pillars may be subjected to plasma for cleaning the pillar. In one implementation, a $O_2$ plasma can be applied for about 0.5 hours. The diameter of the initial pillars may be selected to produce the final desired pillar diameter because of the under etch during the process.

Figure 7:
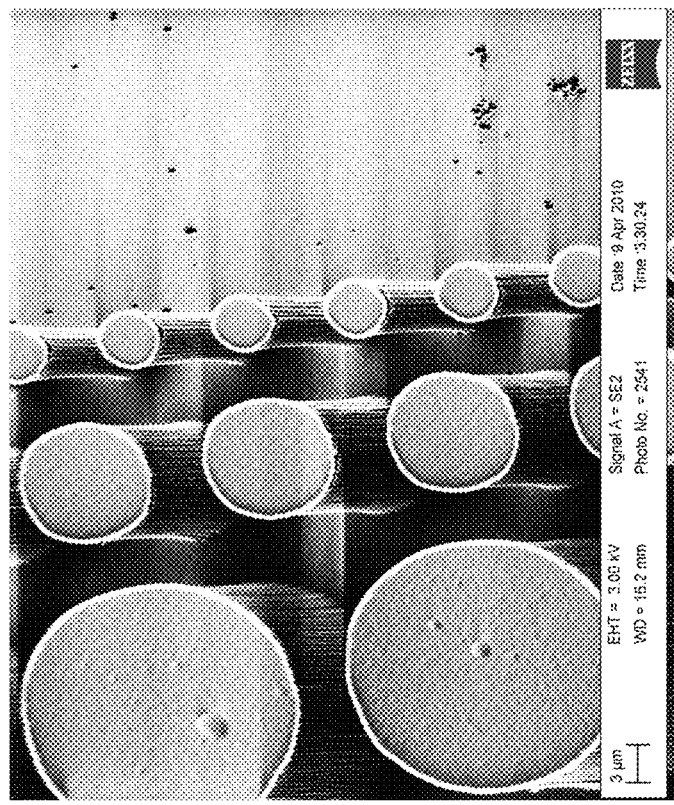
FIG. 7 shows a SEM image of silicon nitride pillars which are about 8.5 micron high.

FIG. 7 shows a SEM image of $Si_xN_y$ pillars which are about 8.5 µm in height. The etching may be performed using a RIE system from Surface Technology Systems PLC using an optimized recipe for vertical sidewalls and smooth side wall surfaces.

The aluminum caps may be removed using an aluminum etcher or hydrofluoric acid (HF) with a wet etching technique. And, an $O_2$ plasma cleaning may further be applied.

Figure 8:
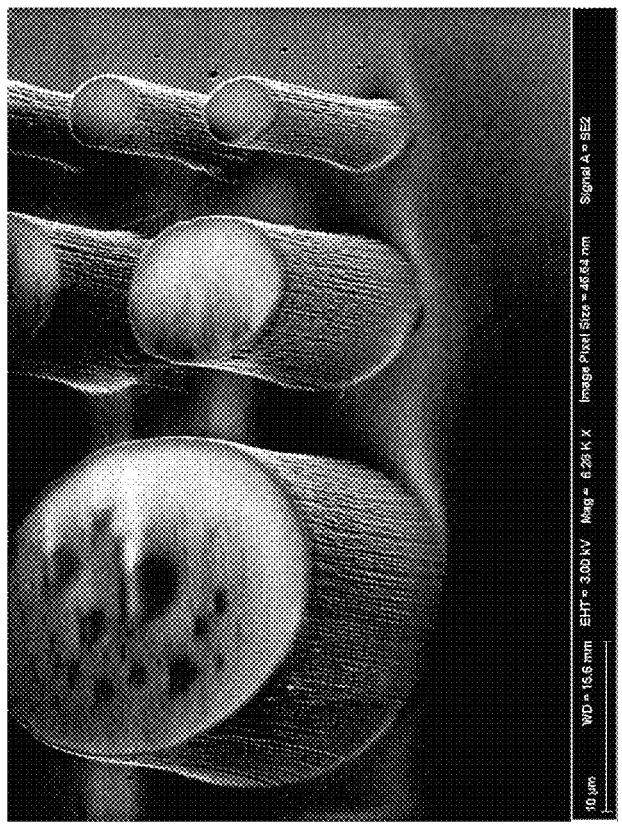
FIG. 8 shows a SEM image of the silicon nitride pillars after the aluminum caps have been removed.

FIG. 8 shows a SEM image of the silicon nitride pillars after the aluminum caps on top have been removed.

Figure 9:
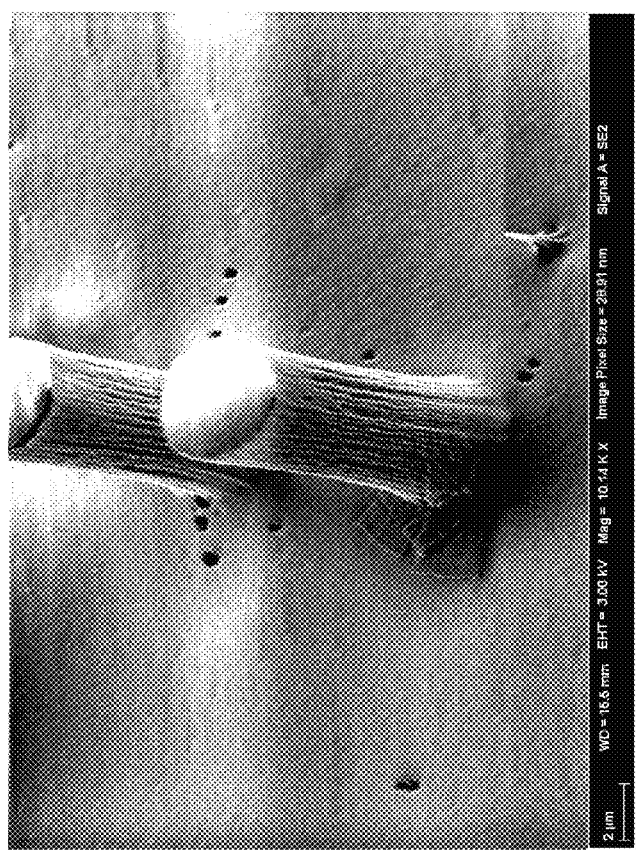
FIG. 9 shows a SEM image showing the polymer at the bottom surface sticking to the surface.

FIG. 9 shows a SEM image showing the polymer at the bottom surface sticking to the surface which can be removed with ultrasound and $O_2$ plasma cleaning process. As shown in FIG. 9, the silicon nitride pillar has a diameter of about 4 µm and the height of about 8.3 µm. It took approximately 2 hours of etching time to produce this diameter. The photomask used to etch the 4 µm pillar was sized 5 µm so that there is a 0.5 µm etching radius in the inward direction.

As can be seen, there are a number of voids (about 100 nm in size) at the bottom surface in the silicon nitride layer. These voids can be very problematic in a subsequent metallization step (because they have the potential to short the photodetectors underneath silicon nitride light-pipes).

To protect the top surface of the pillars, borophosphosilicate glass (BPSG) layer or other glass material (e.g., a 10 µm thick) may be deposited over the silicon nitride pillars. And, a chemical mechanical planarization (CMP) polishing process may be performed to planarize the device surface. Areas to be opened for forming metal interconnect pads may be defined by a subsequent photolithography procedure. In addition, the $SiO_2$ layer may be etched using wet etching technique, e.g., with HF acid.

Figure 10:
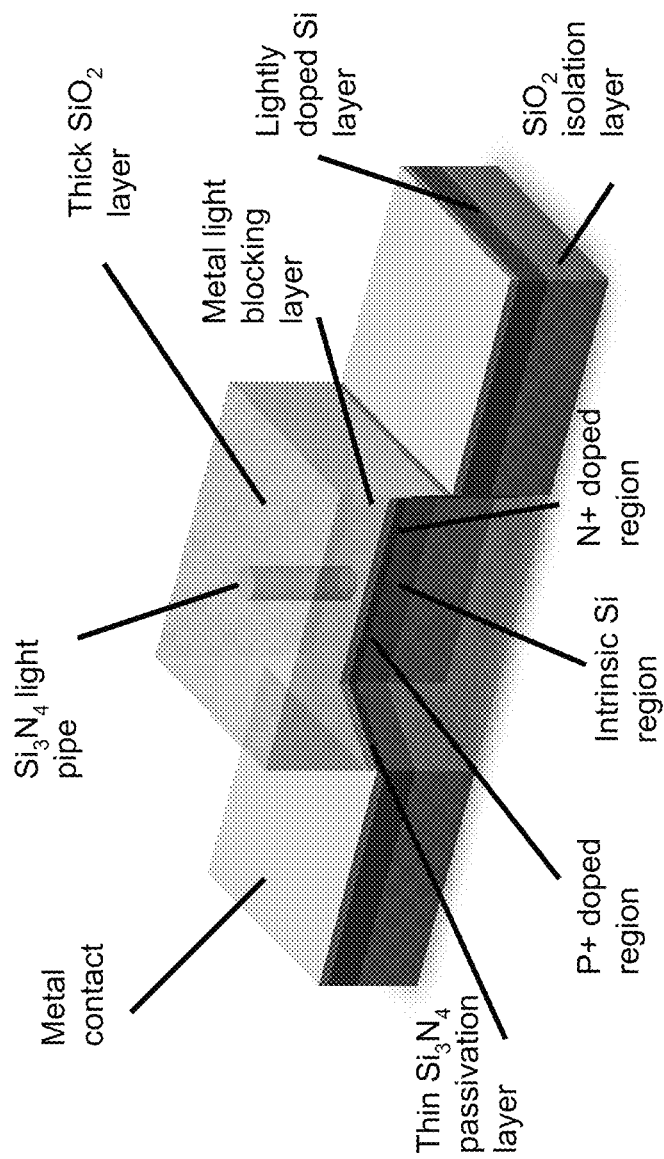
FIG. 10 is an isometric schematic of a completed device structure.

FIG. 10 shows an isometric view of an exemplary image sensor device formed in accordance with an embodiment.

The image sensor device may include an one or more photodetector elements formed (one shown) on a silicon substrate. It will be appreciated that generally such devices will be fabricated to have in excess of 1 million photodiodes, in a (Cartesian) square grid. Each photodiode forms a pixel for the image sensor device.

The silicon nitride lightpipe may have a circular cross-section. A $SiO_2$ layer may be formed around the lightpipe to provide a monolith structure.

The inventors conducted performance testing on various exemplary devices fabricated according to various embodiment disclosed herein. Some of the devices fabricated were then wire-bonded for optical and electrical characterization measurements. The inventors measured the dark and photo-current performance of the Si-based photodetectors.

Figure 11:
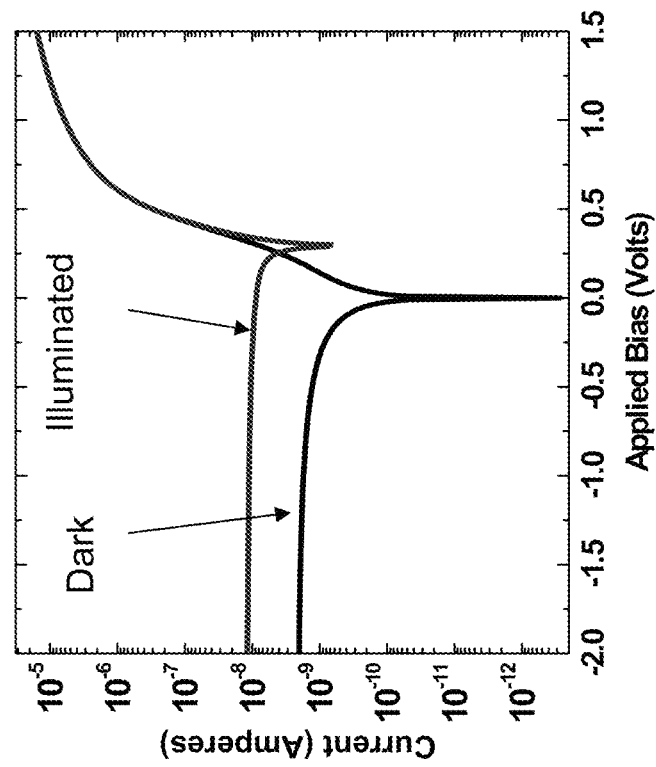
FIG. 11 shows current-voltage (I-V) characteristics of the fabricated photodetectors.

FIG. 11 shows current-voltage (I-V) characteristics of the fabricated PDs. As shown in the figure, the photodetectors achieve photocurrent to dark current ratio of greater than $3 \times 10^4$ for bias voltage close to zero. The dark current is on the order of a few pico-amps at 0V bias voltage and photocurrent of on the order of 10 nAmps for the microscope illumination.

To characterize the light pipe structures with integrated photodiodes, photocurrent measurements were conducted using illumination from a near-field scanning optical microscopy (NSOM) tip.

Figure 12:
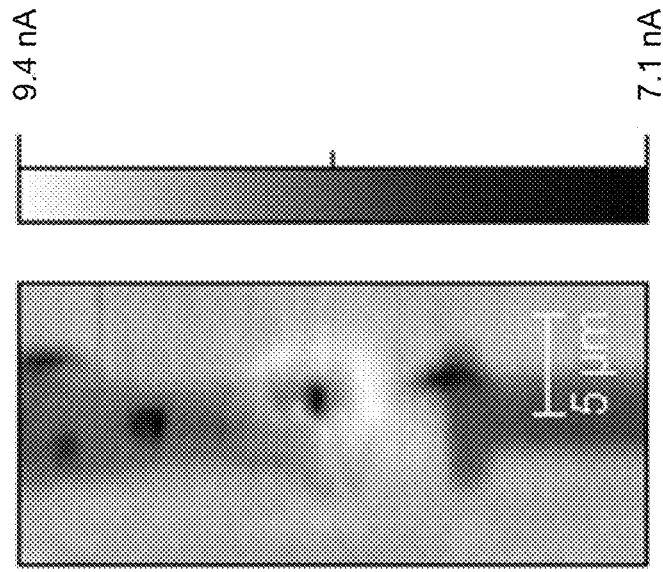
FIG. 12 shows a two-dimensional photocurrent scan of photodiodes having lightpipes.

FIG. 12 shows a two-dimensional (2D) photocurrent scan of the photodiodes with lightpipes in an earlier attempt by the inventors to fabricate silicon nitride light pipes having keyhole features in them. (See FIG. 4). However, this shape was found to deteriorate external quantum efficiency enhancement.

To characterize the fabricated photodiodes, a Keithley low level current electrometer system may be used for current-voltage measurements along with the optical setup. Based on preliminary results, the inventors believe that more than a 200 percent increase in quantum efficiency is expected for wavelengths of 550 nm with this lightpipe structure compared to conventional photodiodes without lightpipes.

The results described herein successfully demonstrate fabrication of lightpipes which are completely fabricated of silicon nitride ($Si_3N_4$) material. In some implementations, one or more silicon nitride lightpipes may be integrated with silicon based photodetectors. Due to the high refractive index of the silicon nitride, lightpipe pillars fabricated from silicon nitride, provide increased quantum efficiency as well as decreased cross talk in the closely packed photodetector arrays in the image sensors.

The foregoing detailed description has set forth various embodiments of the devices and/or processes by the use of diagrams, flowcharts, and/or examples. Insofar as such diagrams, flowcharts, and/or examples contain one or more functions and/or operations, it will be understood by those within the art that each function and/or operation within such diagrams, flowcharts, or examples can be implemented, individually and/or collectively, by a wide range of hardware, software, firmware, or virtually any combination thereof.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation.

In one embodiment, several portions of the subject matter described herein may be implemented by a control system, such as Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs having computer-executable instructions or code running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of computer-readable medium used to actually carry out the distribution.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

All references, including but not limited to patents, patent applications, and non-patent literature are hereby incorporated by reference herein in their entirety.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method comprising:
   forming an etch mask on a silicon nitride layer provided on a wafer; and
   forming a pillar with an aspect ratio of 3 or more, by etching a sidewall in the silicon nitride layer;
   depositing a glass layer on top of the pillar; forming a photodiode element on the wafer; and applying the silicon nitride layer on top of the photodiode element; wherein the wafer is a silicon-on-insulator (SOI) wafer in [100] crystal orientation; wherein forming the photodiode element on the wafer comprises etching the wafer around the region which is to become the photodiode element so as to electrically isolate the photodiode element.

2. The method according to claim 1, wherein the diameter of the pillar is about 4 μm or more.

3. The method according to claim 1, wherein the height of the pillar is about 8 μm or more.

4. The method according to claim 1, wherein the cross-sectional shape of the pillar is substantially circular.

5. The method according to claim 1, wherein the pillar has a sidewall angle of about at least 88°.

6. The method according to claim 1, wherein the pillar has a sidewall surface roughness ($\sigma_{RMS}$) of about 50 nm or less.

7. The method according to claim 1, wherein the silicon nitride has a chemical formula of $Si_xN_y$.

8. The method according to claim 7, wherein the chemical formula is $Si_3N_4$.

9. The method according to claim 1, wherein the etch mask is sized larger than the pillar so as to provide an etching radius.

10. The method according to claim 9, wherein the etching radius is about 0.5 μm in the radial inward direction.

11. The method according to claim 1, wherein the etching comprises reactive ion etching (RIE) including flowing one or more gases to form a pattern in the etch mask.

12. The method according to claim 11, wherein flowing the one or more gases comprises flowing:
    $SF_6$ gas for isotropically etching the silicon nitride; and
    $C_4F_8$ gas for anisotropically etching the silicon nitride.

13. The method according to claim 12, further comprising flowing $O_2$ gas for removing polymer deposits on the silicon nitride that are formed during the etching process.

14. The method according to claim 12, wherein the etch ratio of the silicon nitride is between about 2 to 11 μm/hour.

15. The method according to claim 12, wherein the ratio of the $C_4F_8$ to $SF_6$ gases is between about 0 to 3.0.

16. The method according to claim 1, further comprising:
    forming a metal blocking layer around the pillar.

17. The method according to claim 1, further comprising:
    forming a silicon nitride passivation layer on the SOI wafer.

18. The method according to claim 1, wherein forming the photodiode element on the wafer comprises:
    defining p+ and n+ doping regions on the wafer.

19. A device comprising: a photodetector; a silicon nitride passivation layer directly on the photodetector; a pillar of silicon nitride, configured as a light pipe, directly on the silicon nitride passivation layer; a $SiO_2$ layer around the pillar; and a light blocking layer directly on the silicon nitride passivation layer, under the $SiO_2$ layer and around the pillar, the light blocking layer configured to block light not transmitted through the pillar from reaching the photodetector.

20. A method for fabricating a photodiode comprising:
    forming an etch mask on a silicon-on-insulator (SOI) wafer so as to define a region;
    etching the SOI wafer to form a trench at least partially around the region in an insulating layer of the SOI wafer,
    depositing dopants in the region,
    depositing a silicon nitride layer on the SOI wafer, and
    etching a pillar of silicon nitride on the region from the silicon nitride layer.

21. The method according to claim 20, wherein the trench is about 4 μm.

22. The method according to claim 21, wherein the SOI wafer is in the [100] crystal orientation.

23. The device of claim 19, wherein the photodectector is formed on a silicon-on-insulator (SOI) wafer and, is electrically isolated by the trench formed in an insulator layer of the SOI wafer.

24. The device according to claim 23, wherein the SOI wafer is in the [100] crystal orientation.

25. The method of claim 1, wherein the pillar is essentially vertical to the wafer.

26. The device of claim 19, wherein the pillar is essentially vertical to a wafer.

27. The method of claim 20, wherein the pillar is essentially vertical to the SOI wafer.

28. The device of claim 19, wherein the pillar has an aspect ratio of 3 or more.

* * * * *